United States Patent
DeOrnellas et al.

(10) Patent No.: US 6,774,046 B2
(45) Date of Patent: Aug. 10, 2004

(54) METHOD FOR MINIMIZING THE CRITICAL DIMENSION GROWTH OF A FEATURE ON A SEMICONDUCTOR WAFER

(75) Inventors: Stephen P. DeOrnellas, Santa Rosa, CA (US); Alferd Cofer, Petaluma, CA (US); Leslie G. Jerde, Novato, CA (US); Kurt A. Olson, Sebastopol, CA (US); Paritosh Rajora, Petaluma, CA (US)

(73) Assignee: Tegal Corporation, Petaluma, CA (US)

( * ) Notice: Subject to any disclaimer, the term of this patent is extended or adjusted under 35 U.S.C. 154(b) by 313 days.

(21) Appl. No.: 09/880,584

(22) Filed: Jun. 13, 2001

(65) Prior Publication Data

US 2001/0031561 A1 Oct. 18, 2001

Related U.S. Application Data

(60) Continuation of application No. 09/505,420, filed on Feb. 16, 2000, which is a division of application No. 08/974,089, filed on Nov. 19, 1997, now Pat. No. 6,046,116.

(51) Int. Cl.⁷ .............................................. H01I 21/302
(52) U.S. Cl. ..................... 438/714; 438/710; 438/715; 438/720; 216/67; 216/71; 216/75
(58) Field of Search ................................ 438/710, 714, 438/715, 720; 216/67, 71, 75, 76, 78

(56) References Cited

U.S. PATENT DOCUMENTS

| | | |
|---|---|---|
| 4,208,241 A | 6/1980 | Harshbarger et al. |
| 4,457,359 A | 7/1984 | Holden |
| 4,508,161 A | 4/1985 | Holden |
| 4,512,391 A | 4/1985 | Harra |
| 4,535,834 A | 8/1985 | Turner |
| 4,542,298 A | 9/1985 | Holden |
| 4,680,061 A | 7/1987 | Lamont, Jr. |
| 4,743,570 A | 5/1988 | Lamont, Jr. |
| 5,266,157 A | 11/1993 | Kadomura |
| 5,270,266 A | 12/1993 | Hirano et al. |
| 5,421,401 A | 6/1995 | Sherstinsky et al. |
| 5,447,570 A | 9/1995 | Schmitz et al. |
| 5,775,416 A | 7/1998 | Heimanson et al. |
| 6,046,116 A * | 4/2000 | DeOrnellas et al. ........ 438/715 |
| 6,147,506 A | 11/2000 | Ahmad et al. |

FOREIGN PATENT DOCUMENTS

JP  7-130712  5/1995

OTHER PUBLICATIONS

Ohno, et al. *Reactive Ion Etching of Cooper Films in SiC1, and N*, Japanese Journal of Applied Physics, vol. 28, No. 6, Jun. 1978, pp. 11070–1072.

Krogh, et al. *Spectroscopic Diagnostic of Temperature–Controoled Trench Etching of Silicon*, Plasma Chemistry Plasma Processes, 10(2), 1990, pp. 231–233, 239.

* cited by examiner

*Primary Examiner*—George A. Goudreau
(74) *Attorney, Agent, or Firm*—Fliesler Meyer LLP

(57) ABSTRACT

A method for minimizing the critical dimension growth of a feature on a semiconductor wafer includes performing an etch operation in a reactor 20 and controlling the temperature of the wafer 26 by controlling the pressure of the gas contacting the backside of the wafer 26 and/or providing a heat source 56 such as for example in the chuck 46 or electrode 28 associated with the wafer 26 in order to heat the wafer 26.

16 Claims, 8 Drawing Sheets

METHOD FOR MINIMIZING THE CRITICAL DIMENSION GROWTH OF A FEATURE ON A SEMICONDUCTOR WAFER

This application is a Continuation of Ser. No. 09/505,420, filed Feb. 16, 2000, which is a Divisional of Ser. No. 08/974,089, filed Nov. 19,1997, now U.S. Pat. No. 6,046,116.

FIELD OF THE INVENTION

The present invention is directed to a method for minimizing the critical dimension growth of a feature on a semiconductor wafer.

BACKGROUND OF THE INVENTION

The critical dimension (CD) of a feature on a semiconductor wafer is the width of that feature. The pitch is generally defined as the critical dimension plus the distance to the next feature.

For semiconductor processing methodology using etch techniques, a photoresist layer is deposited on top of a material to be etched. The photoresist layer defines the desired features, masking the portion of the layer which is not to be etched and leaving exposed the portion to be etched. During the etching process, materials from a portion of the layer which is etched as well as compounds formed by a combination of the etchant gases and the materials of the layer to be etched, can tend to coat the sides of the desired feature and thereby increase the critical dimension of the feature beyond that defined immediately under the photoresist mask. Such growth of the critical dimension can disadvantageously diminish the distance between the features and adversely affect the functionality of the features.

Accordingly, there is a need to provide a semiconductor processing methodology which allows for the desired features to be appropriately etched without causing a growth of the critical dimension of the feature during the etching process.

SUMMARY OF THE INVENTION

The present invention provides for a methodology which allows for etching of features while minimizing the growth of the critical dimension of the feature during the etched process. The method of the invention determines a direct correlation between the temperature of the wafer during the etch process and the growth of the critical dimension of a feature. In particular, it has been found that the growth of the critical dimension of a feature can be minimized by elevating the temperature of the wafer during the semiconductor processing.

Accordingly, it is an object of the present invention to control and minimize the growth of the critical dimension of a feature on a semiconductor wafer.

It is a further object of the present invention to minimize the growth of the critical dimension by increasing the temperature of the wafer to a level which discourages the growth of the critical dimension.

It is a further object of the present invention to control the critical dimension of the feature during an etch process by controlling the temperature of the wafer.

It is another object of the present invention to minimize the growth of the critical dimension by reducing heat transfer from a chuck holding the wafer in order to increase the temperature of the wafer.

It is still a further object of the present invention to control the critical dimension of the feature by heating a chuck in order to raise the temperature of the wafer.

It is still a further object of the present invention to perform the methodology of minimizing the critical dimension of a feature during a low pressure semiconductor etch process conducted in the millitorr range with the backside of a wafer kept in contact with a source of gas in the about zero to about 10 torr range in order to reduce the cooling of the wafer due to reduced heat transfer through the gas.

Accordingly, the invention included the method for minimizing the critical dimension growth of a feature located on a wafer during an etch process including the steps of placing a wafer on a chuck in an etch reactor and etching the wafer in the etch reactor. The method further includes allowing the temperature of the wafer to climb to the range of about 130° C. to about 300° C. in order to minimize the critical dimension growth of the feature located on the wafer.

In another aspect of the invention, the method for minimizing critical dimension growth of a feature located on the wafer during an etch process includes the steps of placing a wafer on a chuck in a etch reactor and controlling the temperature of a wafer by maintaining a gas in contact with a backside of the wafer.

The process further includes etching a wafer in the etch reactor and allowing the temperature of a wafer rise in order to minimize the critical dimension growth of a feature located on the wafer by reducing the pressure of the gas in contact with the backside of the wafer.

A further aspect of the invention includes minimizing the critical dimension growth of a feature located on a wafer during an etch process including the steps of placing a wafer on a chuck in an etch reactor and controlling the heat transfer from the wafer in order to allow the temperature of the wafer to climb in order to minimize the critical dimension growth of the feature on the wafer.

Other objects, advantages, and features of the invention will be described hereinbelow and evidenced in the claims and figures.

DETAILED DESCRIPTION OF THE PREFERRED EMBODIMENT

Figure 7:
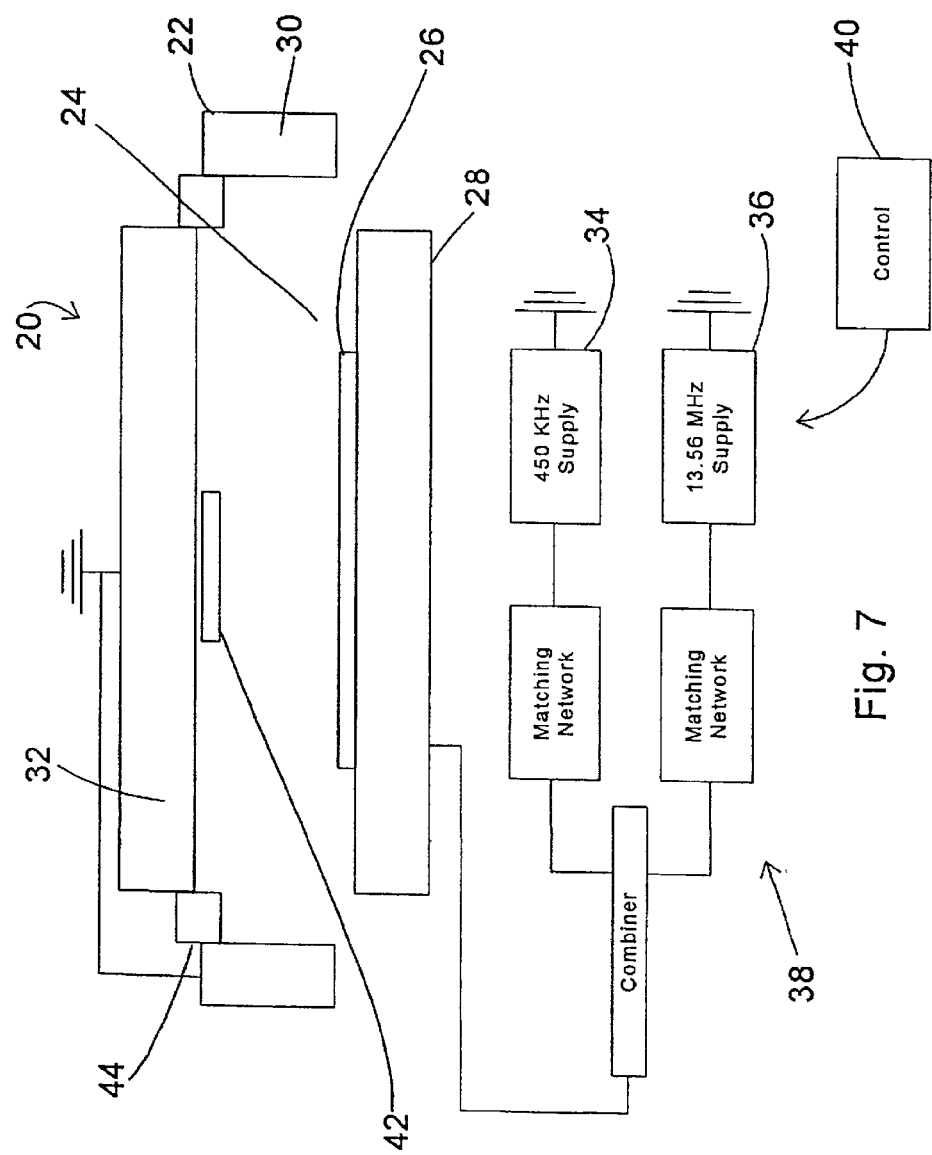
FIG. 7 depicts an etch reactor wherein the method of the present invention can be carried out.
Figure 8:
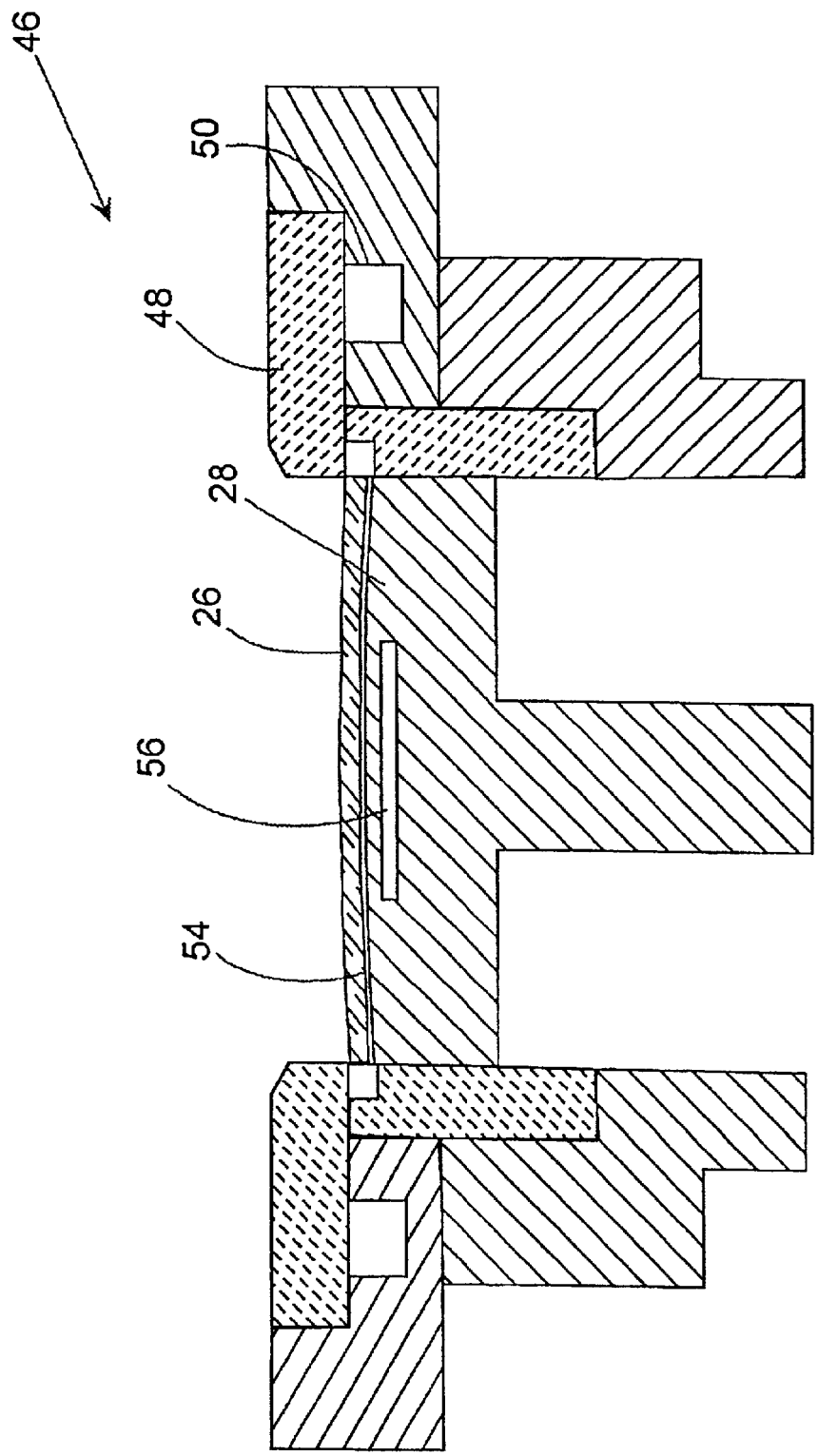
FIG. 8 depicts a cross-sectional view of chuck used with the etch reactor of FIG. 7.

The method of the present invention can be performed in an etch reactor such as the etch reactor depicted in FIG. 7 using the chuck configuration such as the chuck configuration shown in FIG. 8. It is to be understood that other reactors including but not limited to other etch reactors and other chuck configurations can be used and be within the scope and spirit of the invention.

The etch reactor of FIG. 7 is identified by the number 20 and is configured as a tri-electrode reactor. The etching apparatus 20 includes a housing 22 and an etching chamber 24. A wafer 26 is positioned on a bottom electrode 28. The chamber 24 further includes side peripheral electrode 30 and an upper electrode 32. In a preferred embodiment, the side peripheral electrode 30 can be grounded or allowed to establish a floating potential as a result of the plasma developed in the chamber 24. The upper electrode 32 is generally grounded. In typical operation, both the side peripheral electrode 30 and the upper electrode 32 are grounded as shown in FIG. 7.

Preferably two A.C. power supplies, first power supply 34 and second power supply 36, are connected to the bottom electrode 28 through a appropriate circuitry 38 which includes matching networks and a combiner. Further a controller 40 controls the sequencing of the first and second AC power supplies 34, 36. Typically, the first power supply 34 operated in the kilohertz range and is optimally provided at about 450 KHz, and typically in the range of less than 500 KHz. The second power supply 36 operates in the megahertz range, and typically operates at about 13.56 MHz, although other frequencies above about 1 MHz and also multiples of 13.56 MHZ can be used with the present invention. The power supply 34 is powered at 200 watts and the second power supply 36 is powered at 500 watts for this example. Ion energy increases towards the kilohertz range while ion density increases towards the megahertz range. Additionally, reactor 20 includes gas inlet head 42 and a gas outlet port 44.

Turning to FIG. 8, the chuck which is incorporated in the bottom electrode 28 is shown in greater detail. As can be seen in FIG. 8, the chuck configuration 46 includes a wafer clamp 48 which is spring loaded using springs 50 in order to hold a wafer 26 against the lower electrode 28. The gas which controls heat transfer from the wafer is delivered in the gas delivery space 54 located between the wafer 26 and the lower electrode 28. In a preferred embodiment, the wafer claim 48 is made of a high purity alumina ceramic and the configuration is set up that when the gas contained in gas delivery space 54 is helium that the gas leak rate into the reactor chamber 24 is on the order of less than 2 SCCM with a typical process flow rate being for example, 80 SCCM.

As will be explained below, alternative to or in addition to the modification of heat transfer from the wafer due to the control of the gas pressure (wafer clamp pressure) in the gas delivery space 54, the chuck 46 can itself be heated in order to heat the wafer. Such heating can be the result of, for example, a resistive heater 56 contained in the lower electrode 28. Other wafer heating apparatus can be used.

Figure 1:
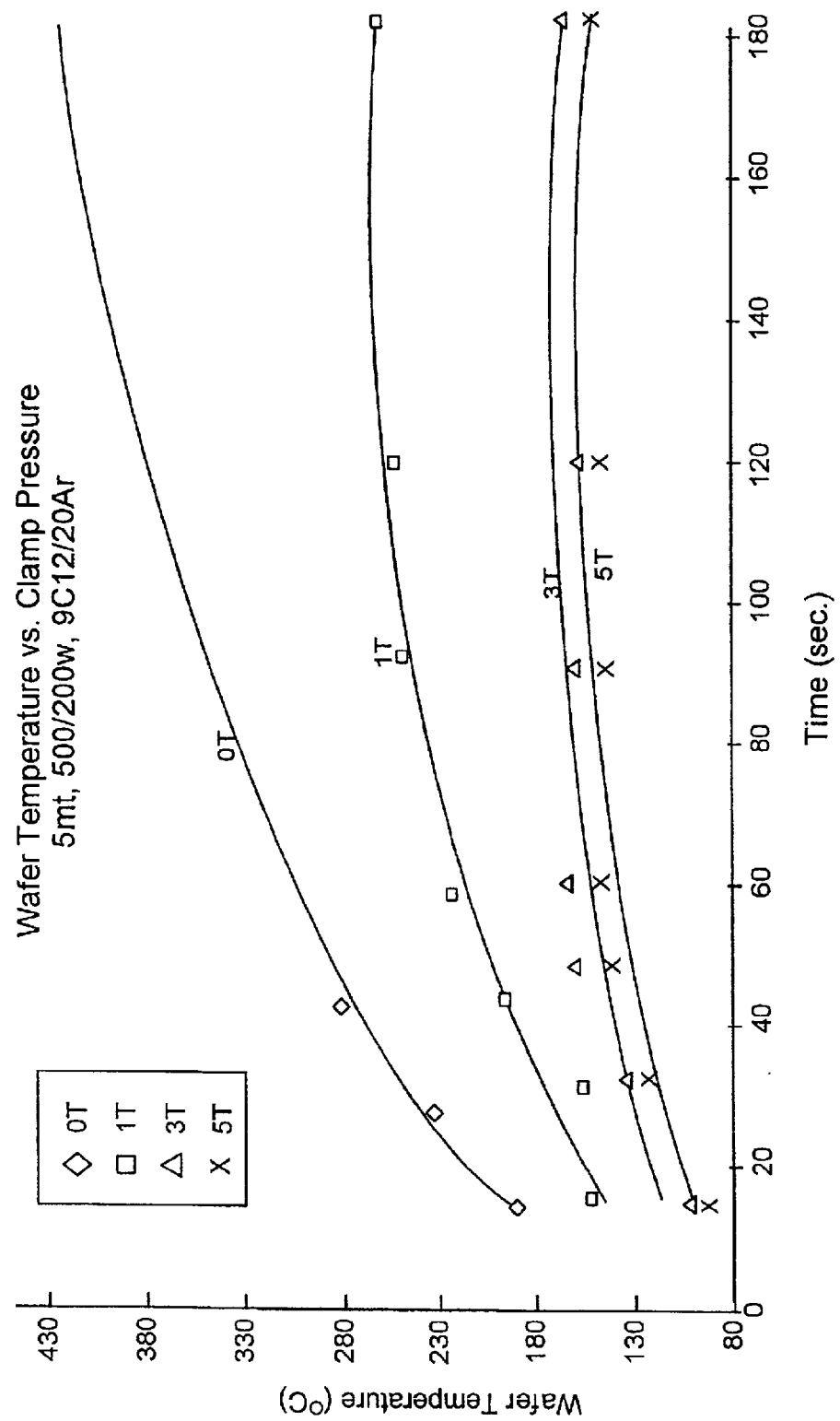
FIG. 1 depicts a wafer temperature versus clamp pressure chart showing the wafer temperature rising over time at increasing lower clamp (wafer baskside) pressures.

Turning to FIG. 1, a chart is shown which depicts the rise in temperature of the wafer over time based on the pressure of the gas located in the gas delivery space 54. For this particular chart in FIG. 1 and also in FIG. 2 and also for purposes of the SEM pictures of FIGS. 3a, 3b, to 6a, 6b, the reactor 20 in FIG. 7 is operated in a low pressure region of about 1 millitorr to about 100 millitorr and in this particular example at approximately 5 millitorr for performing a platinum etch with a chlorine flow rate of 9 SCCM and argon flow rate of 20 SCCM for about 230 seconds. The gas delivered to the gas delivery space 54 is helium, as helium has a good heat capacity, is light and mobile, and is efficient in transferring energy. Other gases such as nitrogen and argon could be used, and in addition any gas that has these characteristics and which will not condense could be used. It will be understood that at least some of these gas will leak into the main reaction chamber 24.

In FIG. 1, four curves are plotted. The curves are for helium pressures of approximately 0 torr, 1 torr, 3 torr, and 5 torr, in the gas delivery space 54. As can be seen generally in FIG. 1, at about 3 torr and greater, the wafer surface temperature goes from about 80° C. to about 140° C. within the first 60 seconds. At a helium pressure of about 1 torr in the gas delivery space 54, the wafer surface temperature goes from about a starting temperature of about 80° C. to over 200° C. in the first 60 seconds and finally levels off at around 240° C. Also as shown in FIG. 1 at close to 0 torr, the temperature of the wafer hits approximately 300° C. in the first 60 seconds and it continues to climb due to the lack of heat transfer from the wafer at such a low pressure for the gas in the gas delivery space 54.

Figure 2:
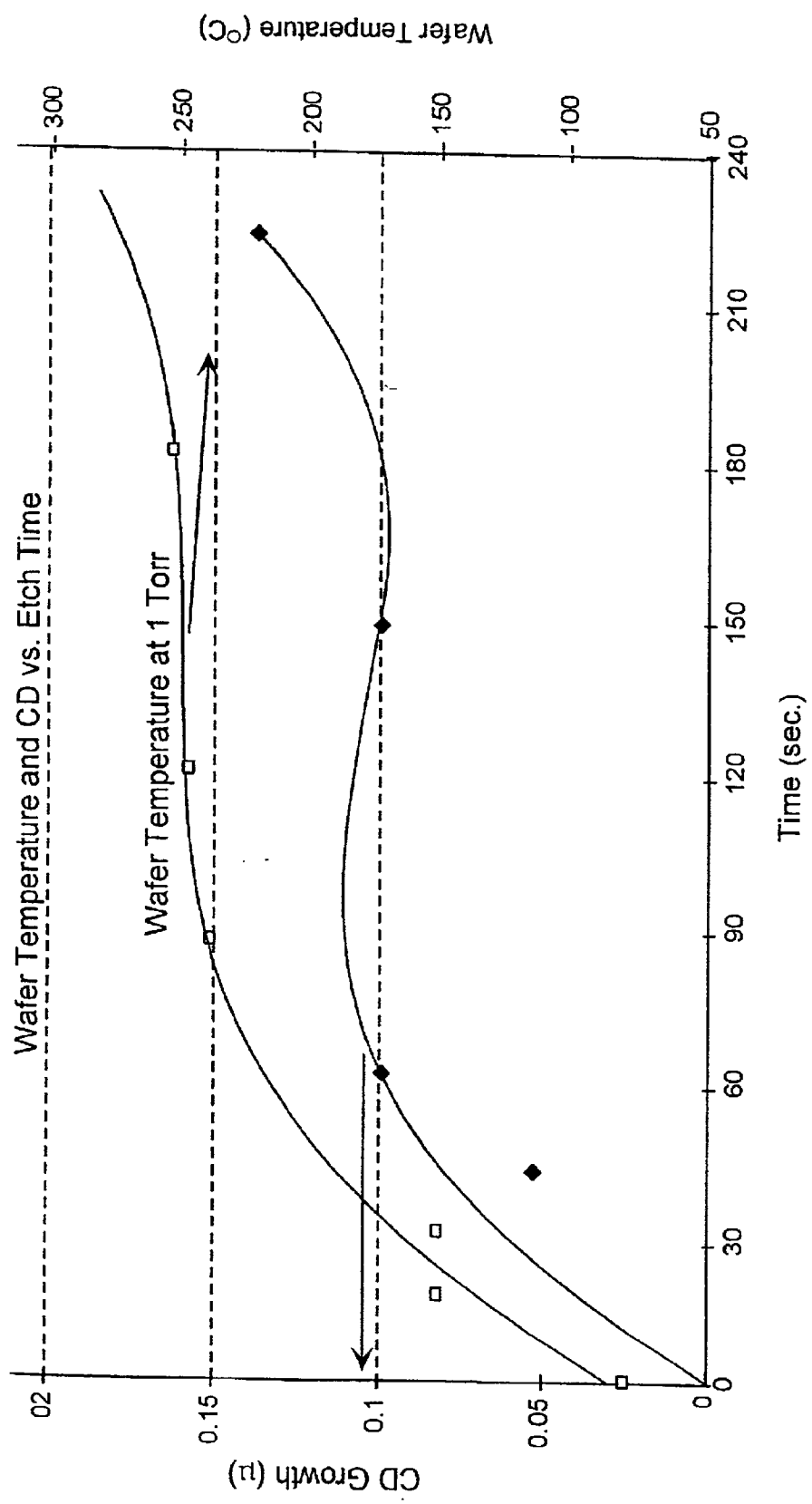
FIG. 2 depicts a chart of critical dimension growth and wafer temperature versus etch time wherein the growth of the critical dimension is reduced and plateaus at elevated wafer temperatures and reduced clamp (wafer backside) pressures.
Figures 3A, 3B:
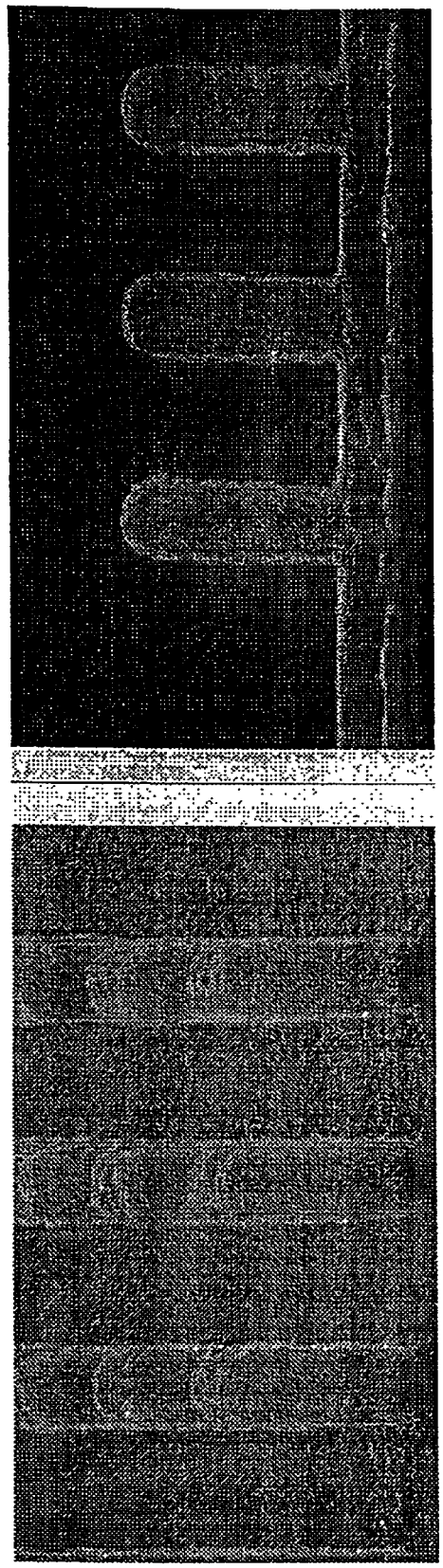
FIGS. 3a and 3b are SEM pictures, perspective and side elevational views of a starting photoresist pattern where the critical dimension is 0.19 microns.
Figure 4B:
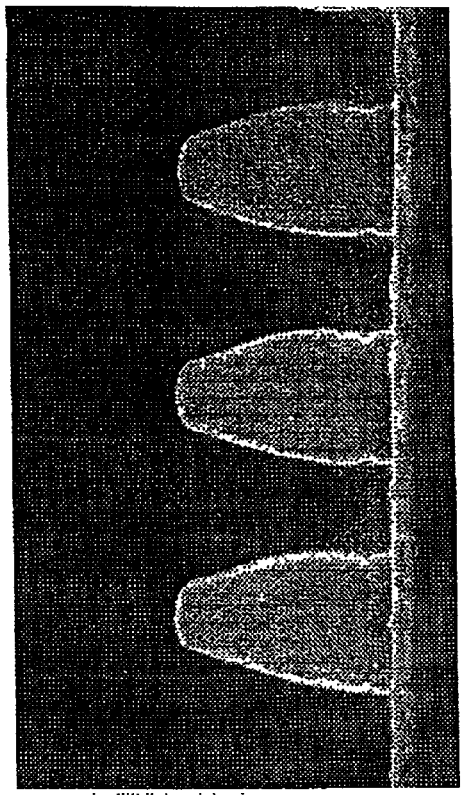
FIGS. 4a and 4b depict the perspective and side elevational views similar to those of FIGS. 3a and 3b at 60 seconds into etch when the critical dimension is 0.29 microns.
Figure 4A:
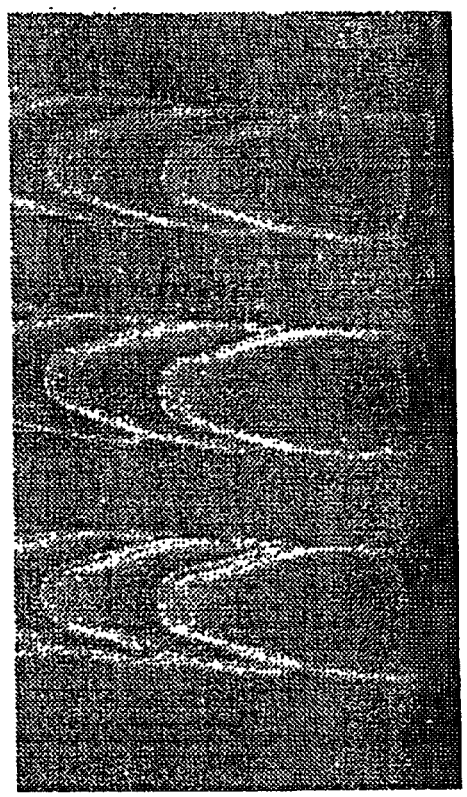
Figure 5B:
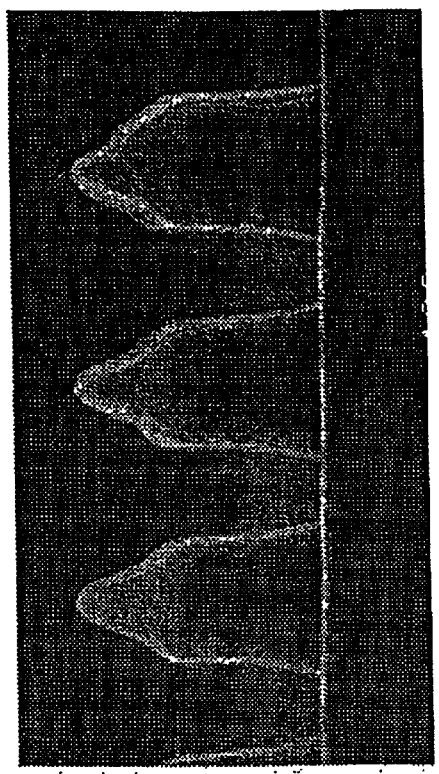
FIGS. 5a and 5b depict the perspective and side elevational views similar to those of FIGS. 3a and 3b at end point of about 150 seconds where the critical dimension remains at 0.29 microns.
Figure 5A:
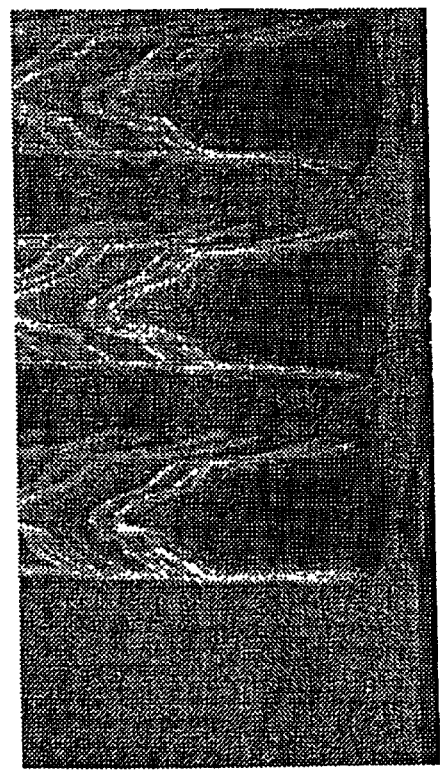
Figure 6B:
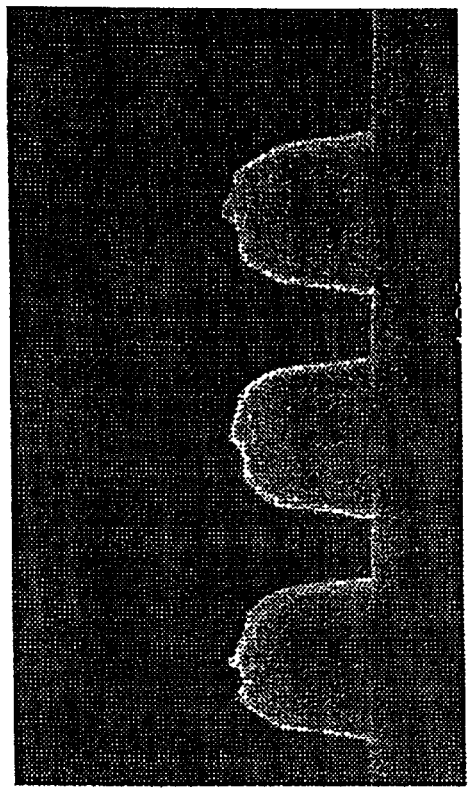
FIGS. 6a and 6b depict the perspective and side elevational views similar to those of FIGS. 3a and 3b at about 230 seconds which is approximately 50% over-etch where the critical dimension has grown to 0.34 microns.
Figure 6A:
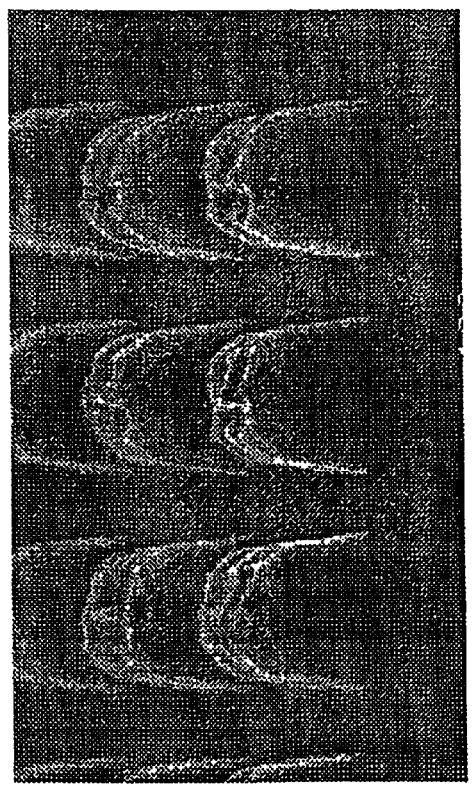

Turning to FIG. 2, a time frame of 0 to 240 seconds for a etch process is displayed. This etch process is with the helium in the gas delivery space 54 held at 1 torr and using all the other characteristics and parameters for gas flow, power and low pressure, as identified with respect to FIG. 1. In this method, the electrode 28 starts at about 80° C. As can be seen in FIG. 2, with these parameters, in the first 60 seconds the wafer temperature rises from about 80° C. to about 230° C. Simultaneous with this rise in temperature, the critical dimension of the feature grows approximately 0.10 microns during the first 60 seconds of the etch processing. Further, as can be seen in FIG. 2, for the time frame of about 60 seconds to about 150 seconds, or for the bulk of the etch process time (90 seconds), there is substantially no growth in the critical dimension as the growth plateaus. After about 150 seconds, the growth continues adding approximately 0.05 microns during the over-etch step from between about 150 seconds to about 230 seconds. This over-etch process time is approximately 80 seconds. During the over-etch time of between 150 seconds to 230 seconds, the temperature of the wafer climbs from about 250° C., to about 275° C. For the example shown in FIG. 2, FIGS. 3a, 3b, 4a, 4b, 5a, 5b, 6a, and 6b, show the profile of the feature and demonstrate the growth of the critical dimension of the feature during the process. In FIGS. 3a, 3b, the starting pattern of the photoresist and the critical dimension of 0.19 microns is depicted. In FIGS. 4a, 4b, after 60 seconds of etch, the critical dimension is approximately 0.29 microns (also see FIG. 2). At etch end point, as shown at FIGS. 5a, 5b, the critical dimension still remains at the plateau of 0.29 microns. At 50% of over-etch, as depicted in FIGS. 6a, 6b, which corresponds to 230 seconds of etch time, the critical dimension has increased slightly to 0.34 microns. From the above, it can be seen that the wafer surface temperature and the critical dimension (CD) are changing in the first 60 seconds of etch process time, with the critical dimension growth plateauing between 60 and 150 seconds and then increasing after that. This indicates a correlation between the critical dimension growth and the wafer temperature. Accordingly, in the first 60 seconds, the critical dimension increases by approximately 0.10 microns and maintains that the dimension from 60 seconds to 150 seconds. During the over-etch process, the critical dimension increases an additional 0.05 microns for a total of approximately 0.15 microns.

The growth in the critical dimension is attributable to the deposit of etched materials and/or compounds of etch materials and process gases on the sidewalls of the feature being etched and the photoresist. Assuming the above process is used for etching a layer of platinum on a semiconductor wafer, the etching causes the platinum and/or a platinum chloride composition to stick to the sidewall surfaces of the feature and the photoresist. If the feature is cold, there is a greater tendency for the materials to stick to the sidewall. Heating the surface by controlling the heat transfer from the wafer such as for example by controlling the gas pressure behind the wafer results in less material sticking to the sidewalls. At lower temperatures, the material sticking to the sidewalls is generally platinum, dichloride ($PtCl_2$) or platinum trichloride ($PtCl_3$). As the temperature increases, the deposits at the sidewall include a thinner layer of platinum, with fewer chlorine compounds being deposited.

It is to be understood that the above process can be performed using other materials and films on the surface to be etched. These materials can include copper (Cu), iridium (Ir), iridium dioxide ($IrO_2$), lead zirconium titanate (PZT), ruthenium (Ru), ruthenium dioxide ($RuO_2$), barium strontium titanate (BST), and bismuth strontium tantalate (Y-1). The materials being etched are either metal or compounds which are of low volatility. Still other films and semiconductor processes can benefit from this method.

As an alternative embodiment, the temperature of the wafer can be controlled by putting a resistive heating element or other heating element in the reactor 20 in order to heat the wafer to the desired temperature. In the embodiment as shown in FIG. 7, a resistive heating element 26 is depicted. Thus, in accordance with the invention, the wafer can be heated (i) by reducing the amount of heat transferred from the wafer by decreasing the pressure of the backside gas such as by decreasing the pressure of helium or (ii) by heating the wafer from a source, or (iii) by a combination of reducing the heat transfer by controlling the pressure of helium gas and heating the wafer using a heat source. These three configurations can be practiced separately and be within the scope of the invention.

It is to be understood that even though the present method was discussed with respect to an etch process, the present method can be used with other semiconductor processes in order to minimize the deposit of materials on a feature and thus, to minimize the growth of the critical dimension.

Industrial Applicability

From the above, it can be seen that the method of the invention is useful for performing an etch or other semiconductor process step while maintaining a minimized critical dimension in order to develop features for submicron dimension products.

Other features, aspects and objects of the invention can be obtained from a review of the figures and the claims.

It is to be understood that other embodiments of the invention can be developed and fall within the spirit and scope of the invention and claims.

We claim:

1. A method for minimizing critical dimension growth of a feature located on a wafer during an etch process including the steps of:

placing a wafer on a chuck in an etch reactor;

etching a wafer in an etch reactor with a feature located on the wafer exposed to etchant allowing growth of the feature in a critical dimension; and controlling the amount of heat transferred from the wafer in order to allow the temperature of the wafer to climb to the range of about 130 C. to about 300 C., thereby minimizing the critical dimension growth of the feature.

2. The method of claim 1 wherein the controlling step includes:

heating the chuck in order to increase the temperature of the wafer.

3. The method of claim 1 wherein the controlling step includes:

using a heat source incorporated with the chuck to heat the wafer.

4. The method of claim 1 wherein the controlling step includes:

allowing the temperature of the wafer to rise to the range of about 130 C. to about 300 C. in the range of about 60 seconds to about 240 seconds.

5. The method of claim 1 wherein:

the controlling step includes setting the pressure of a heat transfer gas in the range of about zero torr to about 10 torr.

6. The method of claim 1 wherein:

the controlling step includes setting the pressure of a heat transfer gas at about 1 torr.

7. The method of claim 1 wherein the controlling step includes:

allowing the wafer temperature to rise from about 225 C. to about 250 C. during the period of about 60 seconds to about 150 seconds from the beginning of etch in order to cause critical dimension growth to plateau.

8. The method of claim 1 wherein the etching is carried out in a low pressure etch reactor which operates in the millitorr range and wherein a gas is contained in contact with the chuck, which gas is in the range of about 0 torr to about 10 torr and is preferably about 1 torr.

9. A method for minimizing critical dimension growth of a feature located on a wafer during an etch process including the steps of:

placing a wafer on a chuck in an etch reactor;

controlling the temperature of the wafer by controlling the amount of heat transferred from the wafer;

etching a wafer in an etch reactor with a feature located on the wafer exposed to an etchant allowing the etchant to stick to the sidewalls of the feature to increase its critical dimension at a first temperature; and allowing the temperature of the wafer to climb above the first temperature during the etching step to a temperature range greater than about 130 C. to less than about 300 C. in order to minimize the critical dimension growth of the feature by reducing the amount of heat transferred from the wafer.

10. The method of claim 9 wherein the allowing step includes:

allowing the temperature of the wafer to rise to the range of about 130 C. to about 300 C. in the range of about sixty seconds to about 240 seconds by the reduction of the pressure of a heat transfer gas.

11. The method of claim 9 wherein the feature is platinum.

12. The method of claim 9 including:

using chlorine gas to etch the platinum feature on the wafer.

13. The method of claim 9 including:

using helium as the gas to control the temperature of the wafer.

14. The method of claim 9 wherein the allowing step includes:

allowing the wafer temperature to rise from about 225 C. to about 250 C. during the period of about 60 seconds to about 150 seconds from the beginning of etch in order to cause critical dimension growth to plateau.

15. The method of claim 9 wherein the etching is carried out in a low pressure etch reactor which operates in the millitorr range and wherein a gas is contained in contact with the chuck, which gas is in the range of about 0 torr to about 10 ton and is preferably about 1 torr.

16. The method of claim 1 wherein:
   said controlling step includes adjusting the degree of thermal insulation of the backside of the wafer.

* * * * *